(12) United States Patent
Lynn, IV

(10) Patent No.: US 8,720,724 B1
(45) Date of Patent: May 13, 2014

(54) PROTECTIVE COVER ASSEMBLY FOR ELECTRONICS

(75) Inventor: Carl S. Lynn, IV, Fredericksburg, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 969 days.

(21) Appl. No.: 12/220,392

(22) Filed: Jul. 18, 2008

(51) Int. Cl.
| | |
|---|---|
| H02G 3/14 | (2006.01) |
| B65D 45/00 | (2006.01) |
| B65D 1/40 | (2006.01) |
| B65D 3/28 | (2006.01) |
| B65D 25/10 | (2006.01) |
| B65D 53/00 | (2006.01) |
| B65D 81/24 | (2006.01) |
| B65D 43/14 | (2006.01) |
| B65D 51/04 | (2006.01) |
| H05K 5/00 | (2006.01) |
| H05K 9/00 | (2006.01) |
| E21F 17/02 | (2006.01) |
| F16L 3/00 | (2006.01) |
| A47B 96/06 | (2006.01) |
| E04G 3/00 | (2006.01) |
| F16B 1/00 | (2006.01) |
| G09F 7/18 | (2006.01) |
| E06B 9/00 | (2006.01) |

(52) U.S. Cl.
USPC ........... 220/241; 220/244; 220/327; 220/730; 220/756; 220/833; 220/845; 220/846; 220/848; 361/755; 361/818; 248/229.24; 248/62; 248/230.5; 109/49.5

(58) Field of Classification Search
USPC ......... 220/327, 244, 848, 833, 730, 756, 845, 220/846, 241, DIG. 21; 361/755, 818; 248/229.24, 62, 230.5, 214; 109/49.5
See application file for complete search history.

(56) References Cited

U.S. PATENT DOCUMENTS

| | | | |
|---|---|---|---|
| 3,575,407 A * | 4/1971 | Carson | 5/600 |
| 3,666,134 A * | 5/1972 | Rauch | 220/324 |
| 4,110,552 A | 8/1978 | Lombardi | |
| 4,470,623 A * | 9/1984 | Judge, Jr. | 292/58 |
| 4,833,334 A | 5/1989 | Valy et al. | |
| 5,208,728 A | 5/1993 | Schirmer | |
| 5,986,211 A * | 11/1999 | Greer et al. | 174/61 |
| 6,354,461 B1 * | 3/2002 | Tenney et al. | 220/836 |
| 6,913,143 B2 * | 7/2005 | Yang | 206/371 |

* cited by examiner

Primary Examiner — Anthony Stashick
Assistant Examiner — Andrew T Kirsch
(74) Attorney, Agent, or Firm — Gerhard W Thielman, Esquire

(57) ABSTRACT

A mechanism is provided for physically protecting an interface on an electronic device having first and second protrusions, each having a surface. The mechanism includes first and second clamping mechanisms, a hinge assembly and a cover plate. Each clamping mechanism has a pair of blocks that are detachably fastenable together. As assembled along the protrusion surface of the device, the blocks form a channel that rigidly engages that surface. The hinge assembly forms a pivotable joint and can be removably attached to the first clamping mechanism to orient the pivotable joint substantially parallel to the interface. The cover plate can be removably attached to the hinge assembly for disposal to swing on the pivotable joint between closed and open positions. In the closed position, the cover plate securely connects to at least the second clamping mechanism.

3 Claims, 3 Drawing Sheets

PROTECTIVE COVER ASSEMBLY FOR ELECTRONICS

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to a mountable cover plate. In particular, the invention relates to a protective plate for sensitive electronic interfaces. The plate can be readily installed onto conventional attachments for the interface components, and enable convenient access as desired.

Infantry assigned to patrol hostile territory can encounter an improvised explosive device (IED) disposed to cause damage and injury to personnel and equipment. Efforts to detect and disable such irregular weapons include projects under the Counter Remote-controlled IED Electronic Warfare (CREW) office.

Various military vehicles used by the United States armed forces employ a CREW Vehicular Receiver/Jammer (CVRJ) to aid troops in the field to defeat the IED. The CVRJ has electronic components connected to auxiliary equipment by cables. The CVRJ is commonly located in the vicinity of a vehicle's gunner and/or other troops.

SUMMARY

Conventional operations using the CVRJ in a military vehicle yield disadvantages addressed by various exemplary embodiments of the present invention. In particular, a mechanism is provided for physically protecting an interface on an electronic device that includes first and second protrusions, each having a surface. The mechanism includes first and second clamping mechanisms, a hinge assembly, and a cover plate. Each of these components is attachable and detachable from one another.

Each clamping mechanism has a pair of blocks that are detachably fastenable together. As assembled along the protrusion surface of the device, the blocks form a channel that rigidly engages that surface. The hinge assembly forms a pivotable joint and can be removably attached to the first clamping mechanism to orient the pivotable joint substantially parallel to the interface.

The cover plate can be removably attached to the hinge assembly for disposal to swing on the pivotable joint between closed and open positions. In the closed position, the cover plate securely connects to at least the second clamping mechanism.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which.

DETAILED DESCRIPTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

The proximity of the CREW Vehicular Receiver/Jammer (CVRJ) to military personnel under field conditions renders the cable connections vulnerable to physical interaction and consequent damage. The CVRJ includes an interface at its front with 90° adapters, thereby providing access for maintenance, program instruction and switch initialization. Embodiments of the protective cover are currently in production and have been delivered to the field for operational use to provide protection to the cable and CVRJ interfaces. An initial run of five-hundred units have already been fabricated, and more than three-thousand are planned for production.

The CVRJ Protective Cover Assembly is designed to isolate the front of the CVRJ interfaces from human interference. The mountable cover protects the cables and other features on the front of the CVRJ from being damaged or destroyed by the occupants of the vehicle in which the CVRJ is disposed.

Figure 1:
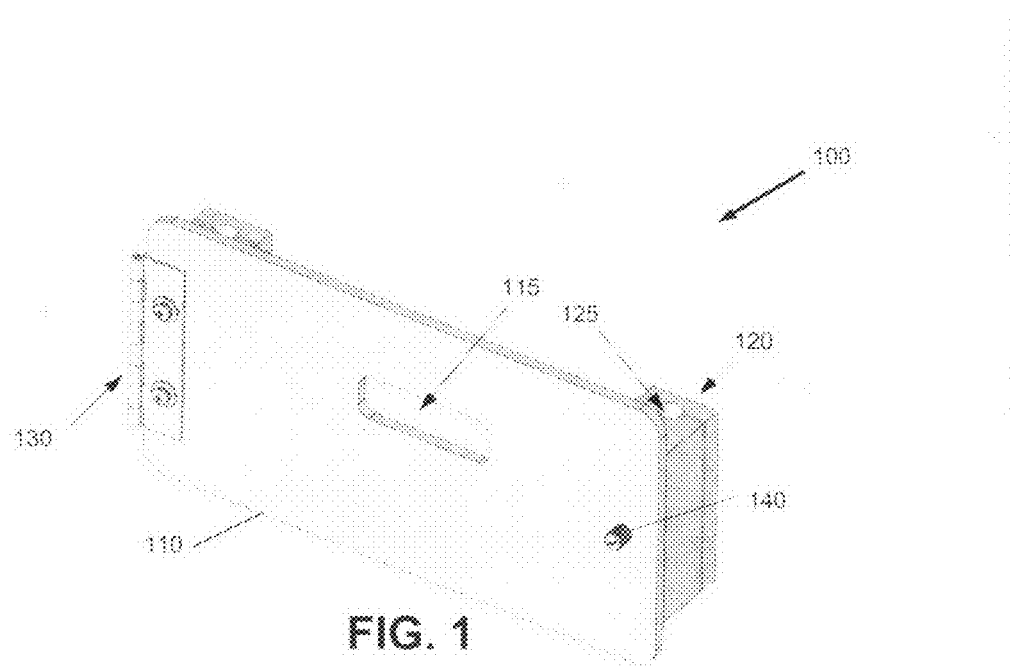
FIG. 1 is an isometric assembled view of a Protective Cover Assembly.

FIG. 1 shows an isometric assembly view 100 of a Protective Cover Assembly for the CVRJ. A cover plate 110 provides physical protection for CVRJ interface components. The obverse front of the plate 110 can be struck to absorb such kinetic impact and protect the components obscured thereby. The plate 110 includes an elongated orifice 115 that serves as a window to a select portion of the components for access while the Protective Cover Assembly remains closed.

The Protective Cover Assembly further includes a pair of handle clamps 120 that form a channel 125, a hinge mechanism 130 and a thumb-screw 140. The handle clamps 120 flank the longitudinal ends on the reverse aft of the plate 110 that faces the components. The channel 125 can have a circular cross-section (e.g., Ø½" or 0.5 inch diameter) or alternate configuration, as preferred to rigidly engage (i.e., frictionally fasten to) a corresponding handle (or similar protrusion) of the CVRJ or associated device. The hinge mechanism 130 pivotably connects the plate 110 to one of the clamps 120. In the configuration illustrated, the plate 110 has a longitudinal length between the clamps 120 that exceeds the plate's width. Also in the arrangement described, the plate 110 can be described as having a pivot side (shown as port) and a swing side (shown as starboard). The thumb-screw 140 could also be replaced with a variety of fasteners such as quarter-turn or push-to-lock style clamps. For the configuration depicted herein, the cover assembly 100 weighs ~4 lbm incorporating the plate 110 having dimensions of 12.5"×6"×½" composed of T6-6061 aluminum.

Figure 2:
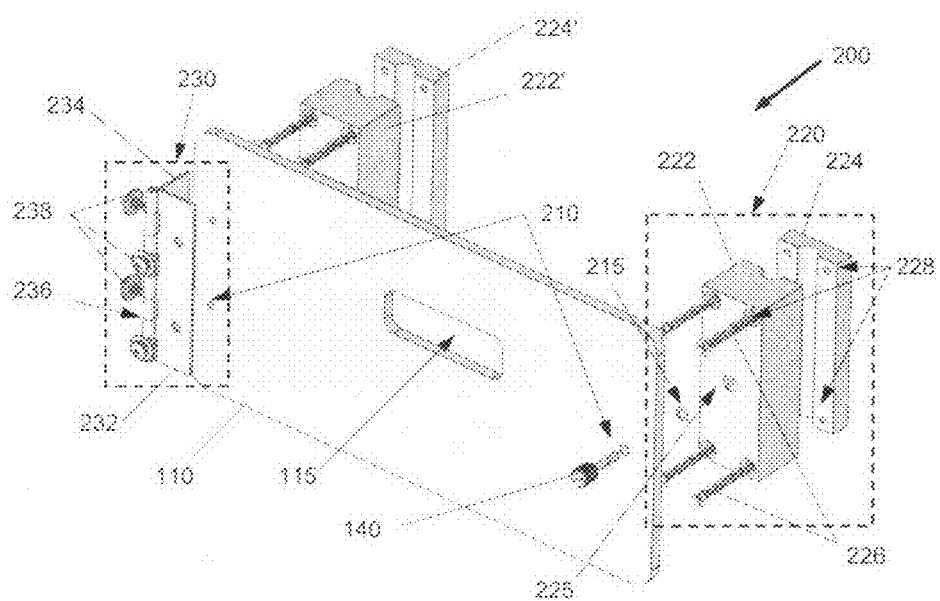
FIG. 2 is an isometric exploded view of components for the Protective Cover Assembly.

FIG. 2 illustrates an isometric exploded view 200 of components for the Protective Cover Assembly. The plate 110 includes three round orifices 210. A single orifice on the swing (starboard) side corresponds to a washer 215. The handle clamps 120 correspond to a mount assembly 220, which includes an aft block 222 and a fore block 224, shown on the swing side. On the pivot (port) sides, the corresponding mount assembly 220 includes aft and fore blocks 222', 224' that for fabrication purposes can be identical except for select round orifices. The thumb-screw 140 inserts into a single orifice on the swing (starboard) side and through the washer 215 to screw into a center threaded orifice 225 within the fore block 224. The aft and fore blocks 222, 224 can be held together near their corners by screws 226 that penetrate through corresponding orifices 228.

The hinge mechanism 130 corresponds to a hinge assembly 230, which includes a fore arm 232 and a lateral arm 234 sharing an edge to form a hinge joint. The arms at the edge join by annular segments that interlink with each other to form a concatenated pivoting joint 236 held by an internal rod or pin longitudinally aligned with the pivot axis. The fore arm 232 is fastened to the plate 110 at swing side orifices 210 by short screws 238. Additional short screws 238 fasten the lateral arm 234 to the (pivot) fore block 222'. Those of ordinary skill in the art will recognize that the screws 226 and 238 inserted into corresponding threaded orifices represent only an exemplary instrument for attachment and are not limiting. Other mechanisms, such as latches and adhesive can substitute for screws.

The configuration described enables the plate 110 to be swung on a vertical pivot axis. The pivot side can correspond to port as shown, or alternatively to starboard, with the thumb-screw 140 engaging on at port. Artisans of ordinary skill will also recognize that the hinge mechanism 130 can alternatively be distributed between both port and starboard clamps 120 to enable the plate 110 to be swung upward or downward from a horizontal pivot axis.

Figures 3A, 3B:
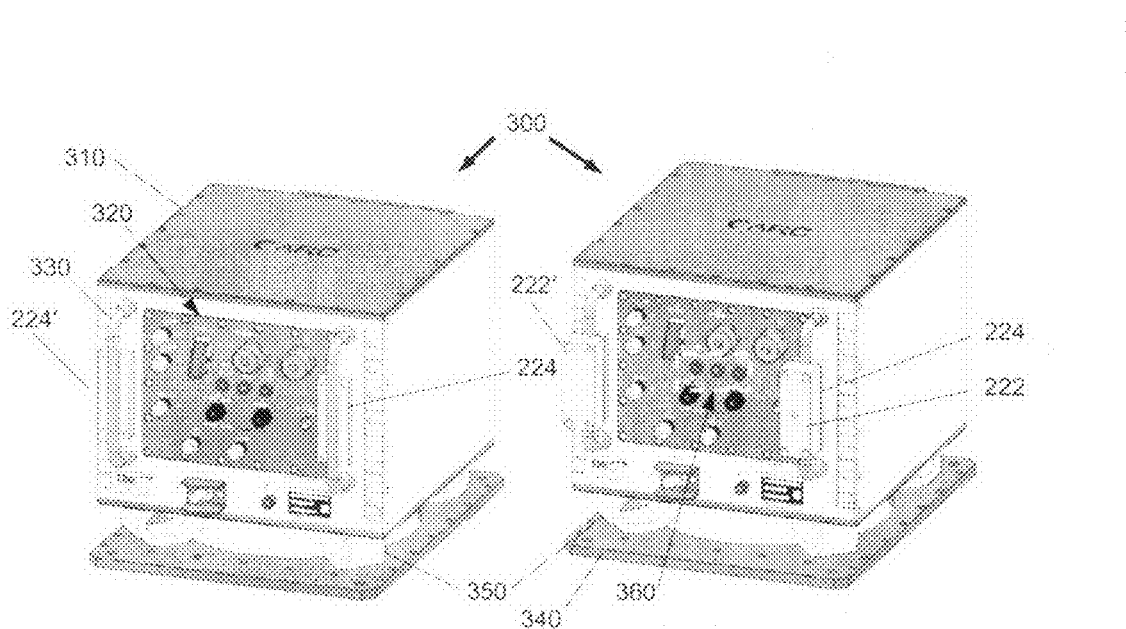
FIGS. 3A and 3B are isometric views of a CVRJ with the handle mounts.

FIGS. 3A and 3B show isometric views 300 of a CVRJ unit 310 with the handle mounts. The CVRJ unit 310 includes an electronics interface 320 with cable connectors, switches and indicators. A pair of handles 330 extends from the unit 310, laterally flanking the interface 320. FIG. 3A shows the aft blocks 224, 224', while FIG. 3B also features the fore blocks 222, 222' as attached to the handles 330. The unit 310 can be disposed on a support platform 340, separated by shock-absorbing spring legs 350 there-between. In the configuration shown, the interface 320 includes a triplet of LED indicators 360 for monitoring status of the CVRJ electronics. The CVRJ unit 310 weighs ~70 lbm, and the handles 330 are separated by about ~10.5". Artisans of ordinary skill will recognize that these parameters are exemplary only, and do not limit the scope of the invention.

Figure 4:
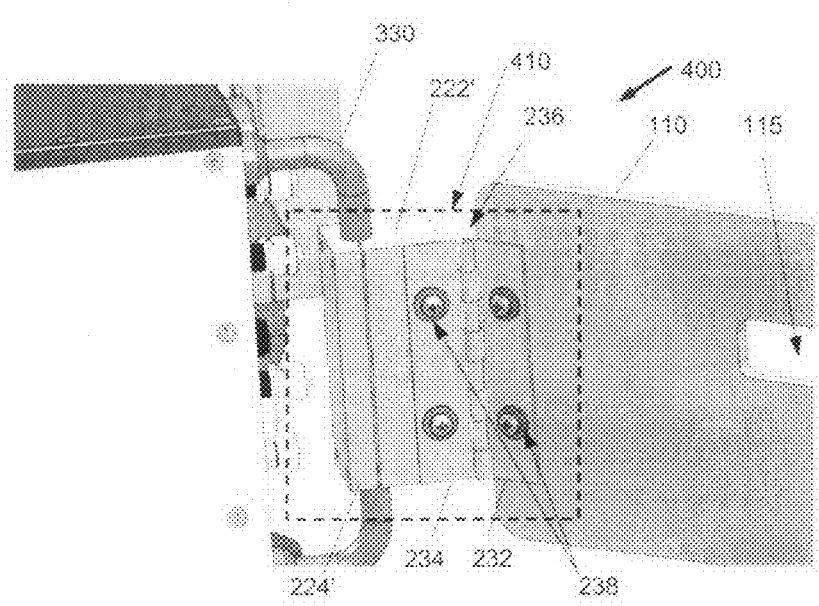
FIG. 4 is an isometric detail view of the CVRJ with the Protective Cover Assembly installed and open.

FIG. 4 provides an isometric detail view 400 of the CVRJ with the Protective Cover Assembly installed and open. The handle 330 on the port side is shown with the fore and aft blocks 222', 224' attached thereto (secured by the screws 226). The hinge mechanism 130 fastens at the lateral arm 234 to the fore block 222' of the (port) handle clamp 120 and at the fore arm 232 to the plate 110 by screws 238. The joint 236 aligns substantially parallel to the handle 330 along the portion enveloped by the channel 125 of the clamp 120. The assembly of the clamp 120 connected to the handle 330 and the hinge 130 attached thereto represents the port side assembly 410. The joint 236 forms a pivot axis substantially parallel to the interface 320, shown in FIG. 4 as being vertical, and extending forward thereof, so that an offset distance separates the plate 110 and the interface 320.

Figures 5, 6:
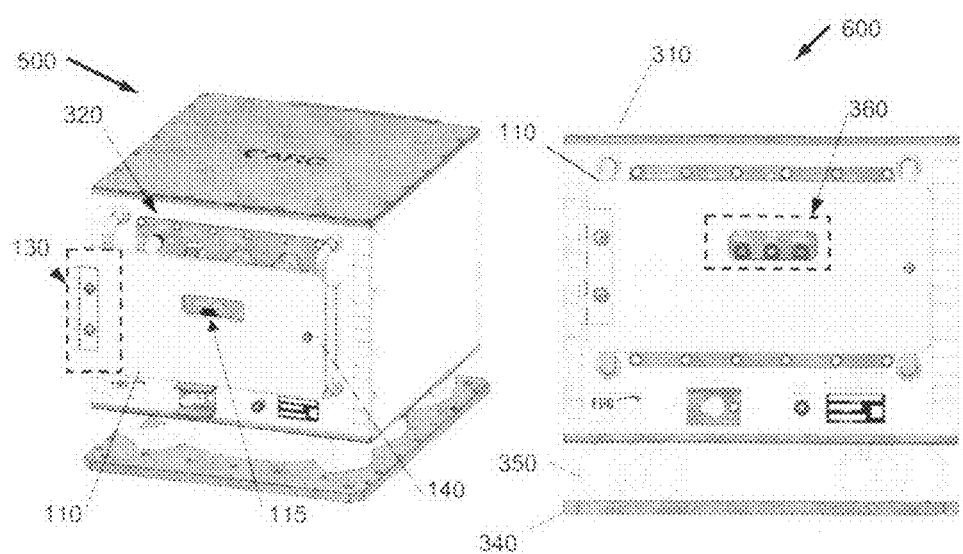
FIG. 5 is an isometric view of the CVRJ with the Protective Cover Assembly installed and closed.
FIG. 6 is an elevation view of the CVRJ with the Protective Cover Assembly installed and closed.

FIG. 5 illustrates an isometric view 500 of the CVRJ with the Protective Cover Assembly installed and closed. The hinge 130 swings the plate 110 to be substantially parallel with the interface 320, separated by a distance corresponding to the thickness of the fore blocks 222, 222'. This separation can be customized depending on the cable thickness and their minimum radius of curvature to securely plug the cables into their corresponding connectors on the interface 320. For the cover assembly configuration depicted in the closed position, the plate 110 has a separation distance from the interface 320 of ~3".

The plate 110 can be secured by the thumb-screw 140 to the swing side clamp 120. The window 115 provides visual access to a portion of the interface 320. FIG. 6 shows an elevation view 600 of the CVRJ with the Protective Cover Assembly installed and closed. The indicators 360 can be visually observed through the window 115, as the unit 310 rests on the platform 340 suspended on its legs 350.

Figure 7:
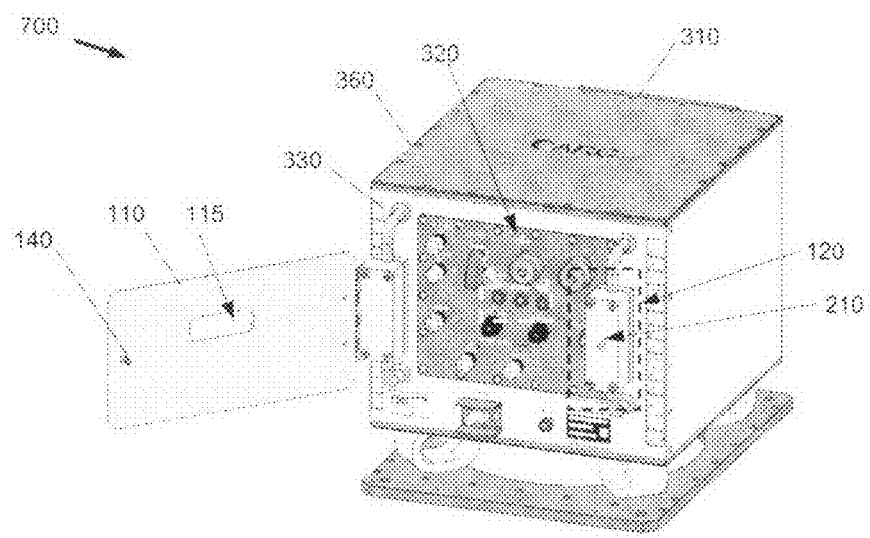
FIG. 7 is an isometric view of the CVRJ with the Protective Cover Assembly installed and open.

FIG. 7 shows an isometric view 700 of the CVRJ with the Protective Cover Assembly installed and open. Upon releasing the thumb-screw 140, the plate 110 can be swung open on the hinge mechanism 130, thereby controllably exposing the entire interface 320, including the indicators 360, as intended.

The Protective Cover Assembly for the CVRJ is designed for permanent or long-term installation, with a hinged cover plate 110 to provide quick access to the cables and switches on the interface 320 at the front of the unit 310. The clamps 120 that attach the Protective Cover Assembly are removable, enabling the components to be detached and stored. The Protective Cover Assembly is first attached to the CVRJ unit 310 by installing the clamps 120 onto the handles 330. The plate 110 is then attached to the pivot side clamp using the hinge mechanism 130, and to enable swinging freely. The cover plate 110 is closed using a thumb-screw 140 through the plate 110 and into the swing side clamp 120. The Protective Cover Assembly remains mounted to the CVRJ unit 310 and the cover plate 110 opened when access is required, and closed when traveling. The Protective Cover Assembly can similarly be detached from the unit 310 by removing the screws 238 that secure the hinge mechanism 130 to the pivot side clamp 120, and to detach both clamps 120 from their respective handles 330.

Because the CVRJ is shock mounted, a cover that protects the cables must effectively either encase the entire unit (i.e., including the platform 340), or attach only to the shock-mounted portion (i.e., above the legs 350). The design of the Protective Cover Assembly enables attachment onto the CVRJ with no modifications to the unit 310. This facilitates expedient installation in any vehicle that is equipped with CVRJ. The mounting method can also be adapted to other applications of equipment having similar environmental and operational requirements as the CVRJ. This also permits access to the front of the CVRJ without the need of tools to remove the entire assembly.

The CVRJ Protective Cover Assembly can be made from a variety materials including but not limited to aluminum, steel, and stainless steel depending on field requirements and material availability. The cover plate 110 can be modified to accommodate any customization alterations, such as in area coverage, shape, location and configuration of window 115, etc, without departing from the inventive concept described in the above embodiments.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A mechanism for physically protecting an interface on an electronic device equipped with first and second parallel handles, each said handle having a surface that extends outward from opposite ends of and parallel to said interface, said mechanism comprising:

first and second clamps for attaching onto the respective handles, each clamp including first and second blocks being detachably fastenable together by screws inserted into corresponding primary threaded orifices to form a channel that rigidly engages the respective surface, said primary threaded orifices disposable through said first block into said second block, perpendicular to the interface and straddling said channel;

a hinge assembly forming a pivotable joint substantially parallel to said handle, said hinge assembly being removably attachable to said first clamp by screws inserted into corresponding secondary threaded orifices disposable through said first block and parallel to the interface; and a cover plate removably attachable to said hinge assembly, said cover plate being disposed to swing on said pivotable joint between closed and open positions, said cover plate in said closed position securely and detachably connecting to said second clamp, wherein said cover plate includes a window for visual access while in said closed position of a select portion of the interface.

2. The mechanism according to claim 1, wherein said cover plate securely connects to said second clamp by a thumbscrew inserted into a corresponding threaded orifice.

3. The mechanism according to claim 1, wherein said channel forms a circular cross-section for receiving the handle.

\* \* \* \* \*